US009761443B2

(12) United States Patent
Park et al.

(10) Patent No.: US 9,761,443 B2
(45) Date of Patent: Sep. 12, 2017

(54) METHOD FOR PASSIVATING SURFACES, FUNCTIONALIZING INERT SURFACES, LAYERS AND DEVICES INCLUDING SAME

(71) Applicant: The Regents of the University of California, Oakland, CA (US)

(72) Inventors: Jun Hong Park, San Diego, CA (US); Andrew C. Kummel, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/170,058

(22) Filed: Jan. 31, 2014

(65) Prior Publication Data

US 2015/0221499 A1 Aug. 6, 2015

(51) Int. Cl.
*H01L 29/76* (2006.01)
*H01L 21/02* (2006.01)
(Continued)

(52) U.S. Cl.
CPC .... *H01L 21/02318* (2013.01); *H01L 21/0228* (2013.01); *H01L 21/02118* (2013.01); *H01L 21/02178* (2013.01); *H01L 21/02304* (2013.01); *H01L 29/1606* (2013.01); *H01L 51/0078* (2013.01); *H01L 51/0562* (2013.01); *H01L 29/0673* (2013.01)

(58) Field of Classification Search
CPC ............. H01L 51/4253; H01L 51/0078; H01L 2251/308; H01L 41/0986; H01L 41/193; H01L 41/45; H01L 51/0046; H01L 51/0047; H01L 51/0091; H01L 51/0092; H01L 51/0558; H01L 51/42; H01L 51/4213; H01L 51/44

USPC .............. 257/40, 14, 288, E29.255, 192, 29; 438/99, 82, 299, 268, 478, 197
See application file for complete search history.

(56) References Cited

U.S. PATENT DOCUMENTS

2003/0054197 A1* 3/2003 Kwong .................... 428/690
2005/0103258 A1* 5/2005 Lazarev .................... 117/89
(Continued)

OTHER PUBLICATIONS

Marcus Freitag, Nanoelectronics goes flat, Aug. 2008, Macmillian Publishers Limited, vol. 3, p. 455.*
(Continued)

*Primary Examiner* — Lex Malsawma
*Assistant Examiner* — Nduka Ojeh
(74) *Attorney, Agent, or Firm* — Greer, Burns & Crain, Ltd.; Steven P. Fallon

(57) ABSTRACT

The invention provides a method for passivation of various surfaces (metal, polymer, semiconductors) from external contaminants, and the functionalization of inert surfaces. The method of the invention can functionalize 2D semiconductor and other insert surfaces such as non-reactive metals, oxides, insulators, glasses, and polymers. The method includes formation of a monolayer, an ordered bilayer or an ordered multilayer of metal phthalocyanines (MPc). The invention also provides layer structure in a semiconductor device, the layer structure comprising one of an ordered monolayer, ordered bilayer or ordered multi-layer of metal phthalocyanine upon a surface, and one of an ALD deposited layer or 2D semiconductor on the one of a monolayer, ordered bilayer or ordered multi-layer of metal phthalocyanine.

17 Claims, 14 Drawing Sheets

(51) Int. Cl.
*H01L 29/16* (2006.01)
*H01L 51/00* (2006.01)
*H01L 51/05* (2006.01)
*H01L 29/06* (2006.01)

(56) References Cited

U.S. PATENT DOCUMENTS

| | | | | |
|---|---|---|---|---|
| 2008/0072960 | A1* | 3/2008 | Kim | B82Y 30/00 136/263 |
| 2012/0090685 | A1* | 4/2012 | Forrest | B82Y 10/00 136/263 |
| 2012/0190139 | A1* | 7/2012 | Na | B82Y 10/00 438/22 |
| 2012/0231580 | A1* | 9/2012 | Yamazaki | H01L 29/7869 438/104 |
| 2013/0240027 | A1* | 9/2013 | Zakhidov et al. | 136/255 |
| 2013/0280546 | A1* | 10/2013 | Elam et al. | 428/472.2 |
| 2013/0320841 | A1* | 12/2013 | Shirai et al. | 313/504 |
| 2014/0150859 | A1* | 6/2014 | Zakhidov et al. | 136/255 |
| 2014/0183736 | A1* | 7/2014 | Cox | H01L 51/442 257/741 |
| 2014/0319452 | A1* | 10/2014 | Seabaugh | H01L 29/1606 257/9 |
| 2015/0263203 | A1* | 9/2015 | Lewis | H01L 31/035218 257/21 |

OTHER PUBLICATIONS

Mazur et al., Spontaneous Solution-Phase Redox Deposition of a Dense Cobalt (II) Phthalocyanine Monolayer on Gold, Jun. 4, 2004, Journal of Physical Chemistry B, 108, 17003-17006.*

Aristov, V. Yu, et al., "Chemistry and electronic properties of a metal-organic semiconductor interface: In on CuPc", *Physical Review B*, 72, pp. 165318-1-165318-7 (2005).

Banerjee, Sanjay K. et al., "Bilayer PsuedoSpin Field-Effect Transistor (BiSFET): A Proposed New Logic Device", *IEEE Electron Device Letters*, vol. 30, No. 2, Feb. 2009, pp. 158-160.

Buchholz, J. C., et al. "The surface structures of phthalocyanine monolayers and vaporgrown films: A low energy electron diffraction study", *J. Chem. Phys.*, vol. 66, No. 2, Jan. 15, 1977, pp. 573-580.

Feenstra, R.M., et al., "Single-particle tunneling in doped graphene-insulator-graphene junctions", *Journal of Applied Physics*, 111, (2012), pp. 043711-1-043711-10.

Geim, A.K., et al., "The rise of graphene", *nature materials*, vol. 6, Mar. 2007, pp. 183-191.

Jandhyala, Srikar, et al., "Atomic Layer Depsoition of Dielectrics on Graphene Using Reversibly Physisorbed Ozone", *ACSNano*, vol. 6, No. 3, 2012, pp. 2722-2730.

Kera, S., et al., "Impact of an interface dipole layer on molecular level alignment at an organic-conductor interface studied by ultraviolet photoemission spectroscopy", *Physical Review B*, 70, (2004) pp. 085304-1-085304-6.

Novoselov, K.S., et al., "Two-dimensional gas of massless Dirac fermions in graphene", *nature*, vol. 438, No. 10, Nov. 2005, pp. 197-200.

Wang, Xinran, et al., "Atomic Layer Deposition of Metal Oxides on Pristine and Functionalized Graphene", *J. Am. Chem Soc.*, 130, (2008), pp. 8152-8153.

Williams, J.R., et al., "Quantum Hall Effect in a Gate-Controlled p-n Junction of Graphene", *Science*, vol. 317, Aug. 3, 2007, pp. 638-641.

Xuan, Yi, et al. "Atomic-layer deposited nanostructures for grapheme-based nanoelectronics", *Applied Physics Letters*, 92, (2008), pp. 013101-1-013101-3.

Yoshimoto, Soichiro, et al., "Host-guest recognition of calcium by crown-ether substituted phthalocyanine array on Au(111): relationship between crown moieties and gold lattice", *Chem. Commun.*, (2003), pp. 2174-2175.

Yoshimoto, Soichiro, et al.,"Effect of Adlayer Structure on the Host-Guest Recognition between Calcium and Crown-Ether-Substituted Phthalocyanine Arrays on Au Single-Crystal Surfaces", *J. Am. Chem. Soc.*, 126, (2004), pp. 8020-8027.

* cited by examiner

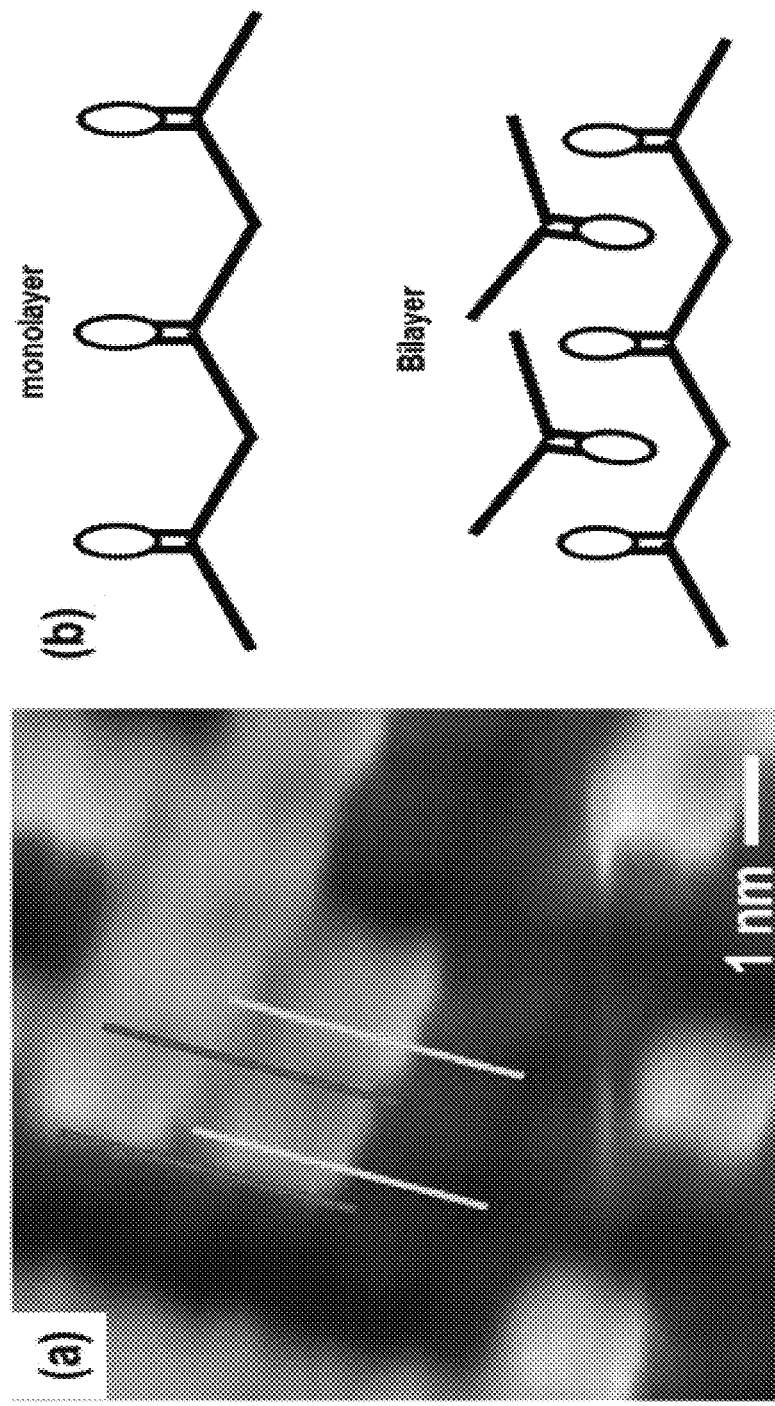

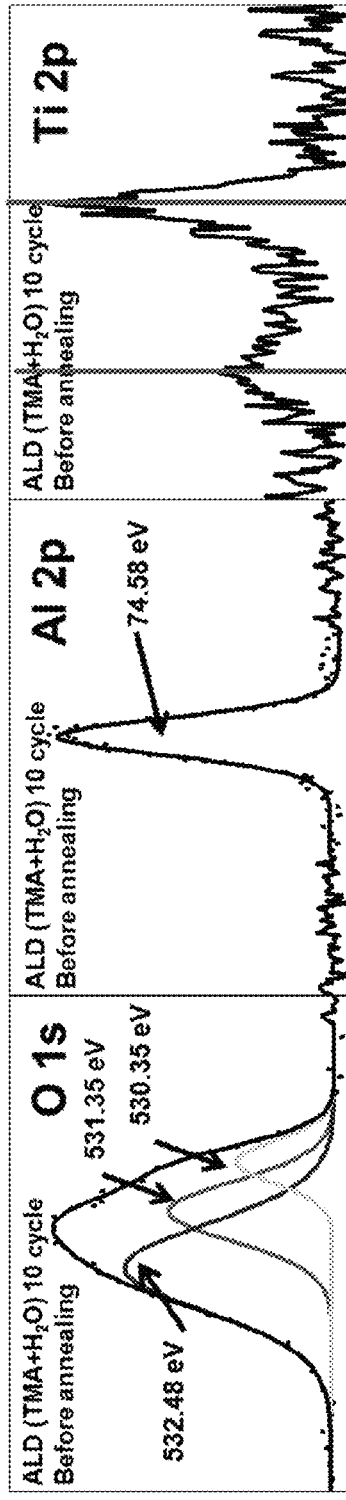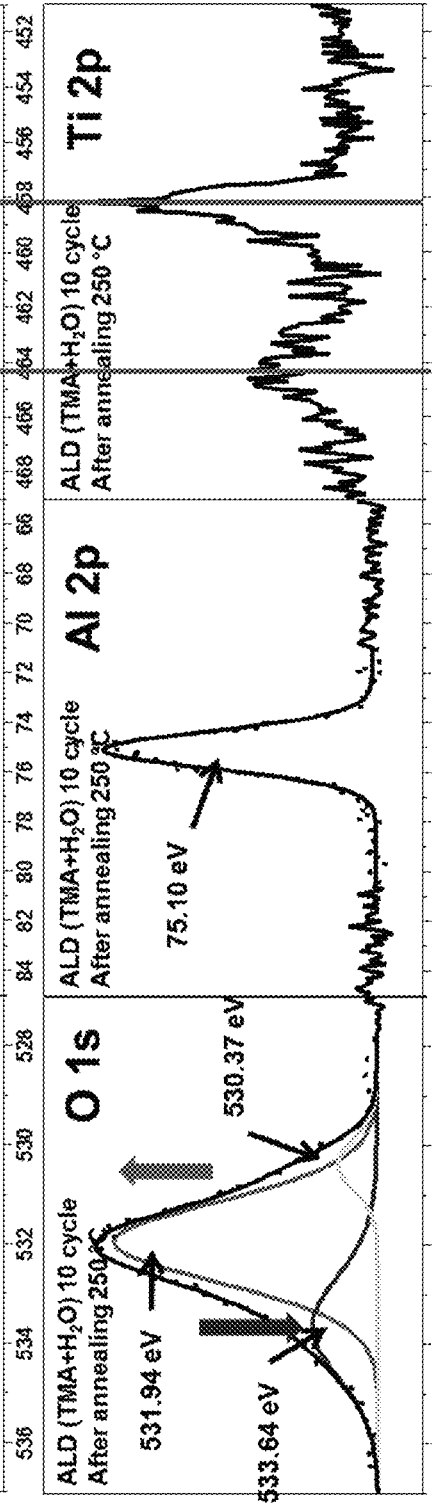

METHOD FOR PASSIVATING SURFACES, FUNCTIONALIZING INERT SURFACES, LAYERS AND DEVICES INCLUDING SAME

STATEMENT OF GOVERNMENT INTEREST

This invention was made with government support under DARPA No. HR0011-13-30002 and NIST No. 70NANB12H107. The government has certain rights in the invention.

FIELD

A field of the invention is semiconductor devices and semiconductor device formation methods. Example applications of the invention include the passivation of various surfaces (metal, polymer, semiconductors) from external contaminants and functionalization of 2D semiconductor and other inert surfaces, such as non-reactive metals, oxides, insulators, glasses, and polymers for gate oxide atomic layer deposition, semiconductor atomic layer deposition, or metal contact deposition.

BACKGROUND 2D semiconductors such as graphene, boron nitride, and metal dichalcogenides (MDCs) are extremely un-reactive. This presents challenges to including 2D materials in device structures. Nucleation of any surface bonding either occurs only at defects, contaminants, or step edges or induced defects. Existing functionalization methods provide low nucleation density.

2-D materials are single layer or a few layers that consist of a network of atoms, such as carbon, $MoS_2$ and $WS_3$. The 2D materials are highly attractive for future electronic devices because the materials provide ballistic transport of charge carriers, resulting in high carrier mobility.

The growth of oxides on graphene is also problematic. Oxide coating is normally performed with plasma on metal or ceramics with physical or chemical vapor deposition or atomic layer deposition (ALD). On the surface, base metal is deposited, then plasma is applied to surface to coat oxide. In the conventional atomic layer deposition (ALD) process on graphene or other 2D semiconductors, the oxide selectively nucleates on defect sites or step edges, due to the chemically passive (non-reactive) nature of the 2D semiconductor basal planes. Such non-uniformly grown oxide can create massive leakage currents in graphene based device. See, e.g., Xuan, Y.; Wu, Y. Q.; Shen, T.; Qi, M.; Capano, M. A.; Cooper, J. A., "Atomic-layer-deposited nanostructures for graphene-based nanoelectronics," Ye, P. D. *Appl Phys Lett* 9 (2008). This non-uniform oxide growth severely limits oxide scaling.

Deposition of dielectric oxide on functionalized graphene via ALD has been studied with respect to techniques that chemically modify the graphene. One technique used gaseous $O_3$ to chemically modify the graphene surface. See, e.g., Jandhyala, S.; Mordi, G.; Lee, B.; Lee, G.; Floresca, C.; Cha, P. R.; Ahn, J.; Wallace, R. M.; Chabal, Y. J.; Kim, M. J.; Colombo, L.; Cho, K.; Kim, J, "Atomic Layer Deposition of Dielectrics on Graphene Using Reversibly Physisorbed Ozone," Acs Nano 6, 2722 (2012). This research reported that ozone molecules are physisorbed on the surface of graphene, and act as nucleation sites for dielectric deposition and that the physisorbed ozone molecules eventually react with the metal precursor. Some of research group has studied covalent bonding nucleation with multiple cycles of a trimethylaluminum (TMA) and $NO_2$ were performed to functionalize the graphene for oxide growth. (See, Williams, J. R.; DiCarlo, L.; Marcus, "Quantum Hall Effect in a Gate-Controlled p-n Junction of Graphene," C. M. Science, 317, 638 (2007)). Other research groups have tried to employ organic layers, such as perylene tetracarboxylic acid (PTCA) to nucleate ALD. See, Wang, X. R.; Tabakman, S. M.; Dai, H. J. "Atomic Layer Deposition of Metal Oxides on Pristine and Functionalized Graphene," J Am Chem Soc 130, 8152 (2008). In this technique, noncovalent functionalization of graphene was reported through the use of carboxylate-terminated perylene molecules. Recent work using perylene tetracarboxylic dianhydride (PTCDA) to nucleate gate still employs thick oxide layer; see Vinod K. Sangwan et al, "Quantitatively Enhanced Reliability and Uniformity of High-κ Dielectrics on Graphene Enabled by Self-Assembled Seeding Layers" NanoLetters, 13, 1162-1167 (2013) and Justice M. P. Alaboson et al "Seeding Atomic Layer Deposition of High-k Dielectrics on Epitaxial Graphene with Organic Self-Assembled Monolayers" ACS Nano 5(6), 5223-5232 (2011). The PTCDA was deposited by molecular beam epitaxy and required 11 nm of gate oxide growth to reduce gate leakage, which indicates the ALD is not nucleated on each PTCA molecule. Furthermore, the most recent paper employs a two temperature ALD process which is slow and the paper states "Less than two monolayers (<2 MLs) of PTCDA were grown in a thermal evaporator (FIG. 1a, Supporting S1), followed by ALD growth of $Al_2O_3$ and $HfO_2$ dielectrics)" indicating than a uniform monolayer of PTCDA could not be formed across large areas.

Graphene has ultrahigh carrier mobility due to its structure that consists of $sp^2$ bonded carbon atoms in a honeycomb lattice forming a single layer. Fabricating conventional transistors with graphene is challenging because intrinsic graphene has zero band gap. Much effort has been devoted to solving this difficulty, and new device models have been proposed. These include BiSFETs (Bilayer pseudoSpin Field Effect Transistor), GIGs (graphene-insulator-graphene devices very similar to BiSFETs), and Tunnel FETs (Field Effect Transistor). For BiSFETs and related devices, the concept is to insert a thin dielectric layer between two layers of graphene thereby generating electrons in one layer and holes in the other layer, which can in turn form electron hole pairs (excitons). With proper bias applied, modeling shows that the BiSFET generates electron hole pairs that show superfluid behavior. Due to this superfluidity, BiSFETs can be operated at a very low voltage, which in turn translates to low-power operation. Simulations show that the switching energy requirements of an inverter-based on the BiSFET will be much lower than an inverter based on existing CMOS (Complementary Metal Oxide Semiconductor) FETs.

Hexagonal Boron nitride has been studied as a 2D material inserted between two sheets of graphene for a tunnel (FET). (See Britnell, L.; Gorbachev, R. V.; Jalil, R.; Belle, B. D.; Schedin, F.; Mishchenko, A.; Georgiou, T.; Katsnelson, M. I.; Eaves, L.; Morozov, S. V.; Peres, N. M. R.; Leist, J.; Geim, A. K.; Novoselov, K. S.; Ponomarenko, L. A., "Field-Effect Tunneling Transistor Based on Vertical Graphene Heterostructures, *Science* 335, 947 (2012)). However, the high dielectric constant (~4.0) of boron nitride can screen electron-hole interactions in the envisioned future practical transistor devices, e.g., the BiSFET. Additionally, the performance of a device based on boron nitride relies on alignment between the top and bottom 2-D semiconductor layers. Commercially practical techniques have not yet been developed to align graphene to inserted materials.

Practical realization of BiSFET devices needs low dielectric constant (K) materials that can be incorporated between two sheets of graphene. High-K materials can screen interactions between electrons and holes, and prevent the formation of excitons which are essential for functioning of the BiSFET. BiSFET devices require a subnanometer of low-κ nonpolar dielectric. GIG devices require a monolayer of low-κ polar dielectric. Tunnel FETs require a few layers of low-κ dielectric.

The BiSFET concept has been simulated with computational models and not yet verified experimentally. Practical materials for the insulating layers have not been developed. Some have proposed an air gap, PDMA polymer layers or PTCDA (Perylene-3,4,9,10-tetracarboxylic dianhydride) layers as being suitable for the necessary insulator layers in a BiSFET. Incorporation of an air gap in a semiconductor structure is difficult, requiring extremely careful processing to avoid contamination during manufacturing. It is also difficult to avoid electrostatic bending of graphene during or after device fabrication. PDMA and PTCDA polymer layers are problematic because it is difficult to form a uniform subnanometer thick coating and difficult to integrate within a practical device fabrication process.

SUMMARY OF THE INVENTION

An embodiment of the invention is a method for passivation of various surfaces (metal, polymer, semiconductors) from external contaminants, and the functionalization of inert surfaces. The method of the invention can functionalize 2D semiconductors and other insert surfaces such as non-reactive metals, oxides, insulators, glasses, and polymers. The method includes formation of a monolayer, an ordered bilayer or an ordered multilayer of metal phthalocyanines (MPc). The MPc can be TiOPc, AlOHPc, VOPc, FePc, CoPc, CuPc or other metal Pc, i.e. M is one of TiO, AlO, VO, Fe, Co, Cu or another metal ion. The MPc also includes crown-ether MPc. Particularly preferred embodiments utilized polar MPc, such as TiOPc, VOPc, or AlOHPc. Other MPc and even non-metal MPcs can be utilized. An example is $H_2Pc$, which can also functionalize 2D semiconductors but with slower, higher pressure processing for ALD gasses.

An embodiment of the invention is a layer structure in a semiconductor device, the layer structure comprising one of an ordered monolayer, ordered bilayer or ordered multi-layer of metal phthalocyanine upon a surface, and one of an ALD deposited layer or 2D semiconductor on the one of a monolayer, ordered bilayer or ordered multi-layer of metal phthalocyanine.

BRIEF DESCRIPTION OF THE DRAWINGS

FIG. 4A is an empty-state STM image of a TiOPc bilayer deposited on HOPG (Vs=2.0 V, It=20 pA) in accordance with an embodiment of the invention; FIG. 4B is a schematic diagram illustrating the TiOPc layer structure and molecular orientation;

FIG. 7B is Expanded STM image from rectangle in FIG. 7A.

FIGS. 9A-9F show the XPS spectra of 10 cycle TMA-$H_2O$ ALD on TiOPc/HOPG that was deposited via a preferred method of the invention;

DETAILED DESCRIPTION OF THE PREFERRED EMBODIMENTS

Figures 1A, 1B:
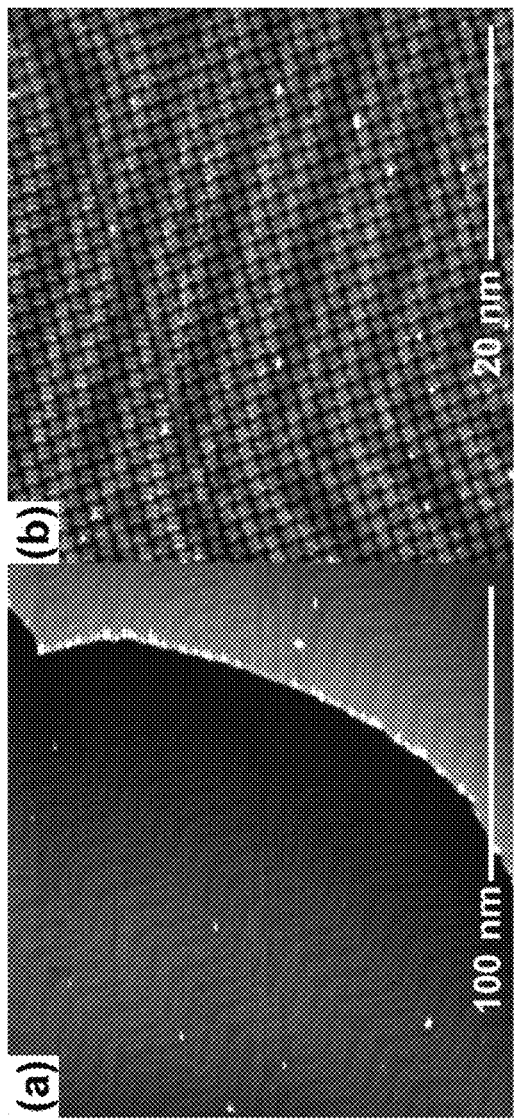
FIGS. 1A and 1B (greater magnification) are STM images of single monolayer of copper phthalocyanine (CuPc) deposited in accordance with an embodiment of the invention with nearly zero defects on and directly in contact with an Au(111) surface.
Figures 2A, 2B:
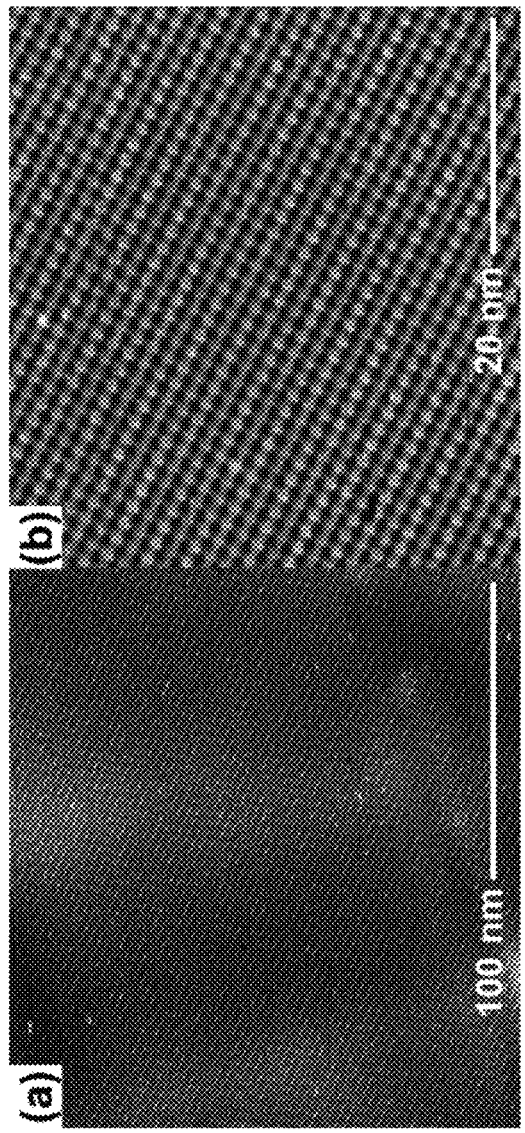
FIGS. 2A and 2B (greater magnification) are STM images of single monolayer of copper phthalocyanine (CuPc) deposited in accordance with an embodiment of the invention with nearly zero defects on and directly in contact with a HOPG (highly ordered pyrolytic graphite)

An embodiment of the invention is a method for passivation of various surfaces (metal, polymer, semiconductors) from external contaminants, and the functionalization of inert surfaces. The method of the invention can functionalize 2D semiconductor and other insert surfaces such as non-reactive metals, oxides, insulators, glasses, and polymers. The method includes formation of a monolayer, an ordered bilayer or an ordered multilayer of metal phthalocyanines (MPc).

The MPc can be TiOPc, AlOHPc, VOPc, FePc, CoPc, CuPc or other metal Pc, i.e. M is one of TiO, AlO, VO, Fe, Co, Cu or another metal ion or even a non-metal $H_2Pc$. The MPc also includes crown-ether MPc. It is noted that although most of MPc molecules can be employed as coating materials, particularly preferred embodiments utilized polar MPc, such as TiOPc, VOPc, or AlOHPc. The polar MPc molecules have much higher reactivity for atomic layer deposition than non-polar MPc including FePc, CoPc CuPc, or H2Pc. In addition, the polar TiOPc, VOPc, and AlOHPc can be deposited directly from solutions which include toluene, Tetrahydrofuran (THF) or 1-phenyloctane (see Xiang-Hua Kong, Yan-Lian Yang, Sheng-Bin Lei, Chen Wang "On the topography multiplicity of non-planar titanyl (IV) phthalocyanine molecules and the STM imaging mechanism" Surface Science 602 684-692 (2008)). The O or OH group provides an extra dipole-moment to MPc nucleating ALD and increasing solubility. The greater solubility in nonpolar solvent is believed (but no aspect of the invention depends upon this belief and understanding of the exact mechanism is not necessary to practice the invention) common for all MPc which have an asymmetric center which reduces intermolecular forces in the crystals. Crown ether MPc are soluble in organic solvent even without a polar center and therefore can also be deposited onto substrates from solution.

Particular preferred methods include solution coating, such as dip, drop or spin coating, and vacuum deposition, which employ molecular beam epitaxy. For solution coating, MPcs are dissolved chloroform, toluene or similar solvent, then a droplet of the solution is put on the metal, semiconductor or 2-D materials or the material is dipped into solution. Afterwards, the deposited sample should be dried with Ar or nitrogen. The coverage and thickness of MPc layer is governed by number of droplets and/or the concentration of the solution. The droplet deposition process can be repeated to insure at least one monolayer deposition or even to insure multilayer deposition. In order to transform from the partial multilayer layer region to a single monolayer or induce a more uniform coverage, the solution deposited films can be annealed in vacuum or in an inert atmosphere (i.e. one which does not react with the MPc or substrate).

Vacuum deposition of MPc layer can be performed by sublimation of MPc molecules in vacuum chamber which can be employed for even for MPc which contain a polar center group (for example TiOPc). It is noted that each MPc molecule has a specific sublimation temperature depending on its central metal ion. After deposition, novel multi layers can be formed and devices constructed based upon the multilayers. For monolayer MPc films, the thicker MPc layer is vacuum annealed to form a perfect monolayer since desorption temperature of the monolayer is higher than the desorption temperature of MPc from MPc layers.

A preferred device is a semiconductor device that includes a dielectric monolayer, bilayer, or multilayer as a thin insulator. The dielectric monolayer, bilayer or multilayer consists of or includes an MPc functionalization and passivation layer.

Preferred devices include 2D semiconductor-insulator-2D semiconductor structures. One embodiment is BiSFET (Bilayer pseudoSpin Field Effect Transistor). Other embodiments include Graphene-Insulator-Graphene devices.

Embodiments of the invention also provide a nucleation template within a structure. The template is formed upon another layer, such as a 2D semiconductor layer. The MPc template passivates and functionalizes the layer and provides for formation of layers such as gate oxide atomic layer deposition (ALD) layers or contact metal deposition layers. In other applications, the MPc nucleation template can be coated on other inert surfaces such as non-reactive metals, oxides, insulators, glasses, and polymers. The template provides passivation for shielding from external contaminants and provides functionalization for the deposition of ALD and other layers.

In accordance with embodiments of the invention, metal phthalocyanines provide a seeding layer for ALD. TiOPc, VOPc, and AlOHPc are preferred MPc that can be deposited (by thermal evaporation in vacuum or from solution) as a highly ordered, flat-lying monolayer after anneal, with the most reactive site (such as O or OH) facing toward the vacuum. These O, OH, reactive sites have intrinsic negative charge and dipole moment, which makes the sites highly reactive to ALD precursor. However, other sites on the MPc may also absorb ALD precursors so even H2Pc may nucleate ALD at sufficient precursor pressure and with fast doing and modest temperature. Consequently, dielectric oxide can be grown uniformly on graphene or other 2D semiconductors. TiOPc and other MPCs have weak van-der-Waals interaction with graphene, and therefore do not induce large electronic perturbatiosn to graphene. The layer can therefore act as a channel material. Employing TiOPc and other MPcs with metal-OH or metal-O centers as seeding layer permits high dielectric oxide to be deposited uniformly on graphene without inducing leakage current in the device.

The MPc molecules readily form symmetric crystal structures (for example 4-fold symmetry) on 2-D materials. Annealing perfects the consistency across large areas. Electron-hole coupling or tunneling do not depend on lattice alignment with 2D materials. The MPc molecules therefore provide a practical material to passivate and functionalize 2D materials and form devices based upon the devices.

Experiments have shown that the MPc functionalization allows high density nucleation on an ordered 1.7×1.7 nm grid (grid size slightly depends on the particular MPc); the grid is slightly larger for crown ether MPs. Experiments showed that a multilayer MPc film is absorbed, and then annealing in vacuum can thin the film to exactly 1 monolayer. A large range of metal phthalocyanines (MPcs), including CuPc, $H_2$Pc, and TiOPc are known after vacuum sublimation and annealing to form ordered monolayers on highly oriented pyrolytic graphite (HOPG) and even on graphene with the MPc molecules lying flat (or nearly flat) on the surface, but now it is shown with the present invention that these films can be used to nucleate subnanometer ALD gate oxide or be used directly as the dielectric in 2D semiconductor devices. The MPc is also expected to form nearly flat monolayers on other 2D semiconductors such as BN, $MoS_2$ and carbon nanotubes as well as other inert surfaces such as non-reactive metals, oxides, insulators, glasses, and polymers. See Strohmaier, R.; Ludwig, C.; Petersen, J.; Gompf, B.; Eisenmenger, W. "Scanning tunneling microscope investigations of lead-phthalocyanine on $MoS_2$," J Vac Sci Technol B 1996, 14, 1079. For solution deposition, crown ether phthalocyanines can also be employed for these same applications since they are known to be soluble and can form flat lying monolayers on surfaces sometimes without even vacuum annealing. It is note that although crown ether phthalocyanines can be deposited as monolayer by solution deposition, multilayer regions are also observed. If high quality of monolayer is required, post annealing should be employed. See, e.g., Yoshimoto et al, "Host-guest recognition of calcium by crown-ether substituted phthalocyanine array on Au(111): relationship between crown moieties and gold lattice," Chem. Comm. 2174-75 (2008); Yoshimoto et al., "Effect of Adlayer Structure on the Host-Guest Recognition between Calcium and Crown-Ether-Substituted Phthalocyanine Arrays on Au Single-Crystal Surfaces," J. Am Chem. Soc. 126, pp. 8020-27 (2004). As previous stated, TiOPc, VOPc, and probably AlOHPc can be deposited from solution and the same annealing procedure would be produce a high quality monolayer film.

Embodiments of the invention demonstrate that an MPc monolayer is active layer for ALD deposition of important materials for the formation of 2D materials. Advantageously, the MPc can be deposited on and in direct contact with many surfaces by simple dipping, dropping, or spin coating. Example surfaces include metal and glass layers. Oxide can therefore be deposited on MPc layer/metal or MPc layer/glass via embodiments of the invention, and via a method that does not require plasma or high voltage, as used in typical prior processes to form oxide layers on 2D layers.

Experiments carried out to demonstrate embodiments of the invention show that present MPc based layer structures, including monolayer, bilayer and multilayer MPc, can provide the necessary low K dielectric for various new device designs, including BiSFET, GIG and Tunnel FETs. The tunnel FET also will operate with and benefit from low voltage. In a preferred embodiment, an MPc monolayer, ordered bilayer or ordered multilayer is between two layers of 2-D materials and provides a resonance tunneling signal in a tunnel FET.

Embodiments of the invention provide a device structure that includes MPc monolayers, ordered bilayers, or ordered multilayers as a low K dielectric between two 2D semiconductor layers. There are many alternative 2D semiconductor-insulator-2D semiconductor devices that need a sub 1 nm physical thickness insulator, and the MPc device structures of the invention provide a practical solution to address that need. In preferred embodiments, the device structure is a layer stack having MPc monolayers, ordered bilayers, or ordered multilayers as a low K dielectric between 2D semiconductors selected from the group including graphene, Boron Nitride, and metal dichalcogenides. Other devices include a metal layer on one side and 2D on the other. Particular memory devices have a bottom layer of metal instead of a 2D semiconductor.

In preferred embodiments, an MPc monolayer, ordered bilayer, or ordered multilayer on a substrate provides a low K dielectric that can be used to nucleate other chemical processes including atomic layer deposition of gate oxides and metal contact deposition. This serves as the basis to form many device structures. For example, TiOPc will form chemisorbates with a metal precursor such as trimethyl aluminum (TMA), or an OH donor such as $H_2O$ or HOOH, which can nucleate gate oxide ALD. Alternatively, a metal containing precursor such as CoPc can be dosed with $H_2O$ to form HO—Co-Pc, which will nucleate gate oxide ALD. For contacts, metal atoms will nucleate on the center of TiOPc or on the nitrogen atoms of MPcs. See, Aristov et al, "Chemistry and electronic properties of a metal-organic semiconductor interface: In on CuPc," Physical Review B 72, 165318 (2005).

Additional embodiments of the invention provide a novel gate stack in conventional FETs, which is based on MOSFET, or in 2D semiconductor-insulator-2D semiconductor devices. Additional embodiments of the invention include nanostructures with an MPc monolayer, ordered bilayer or ordered multilayer as dielectric. Example nanostructures include 2D nanowires, carbon nanotubes and 2D semiconductor FETs. Additional nanostructures include 2D semiconductors such as Boron Nitride and dichalcogenides (for example $MoS_2$).

With the invention, Oxide/MPc layer structures can also be deposited on other inert surfaces, such as non-reactive metals, oxides, insulators, glasses, and polymers. The Oxide/MPc layer structures serve as protecting layer. A functional group, such as OH, can be added to central area of the MPc molecules to get maximum nucleation density by inducing the molecules to lie flat on certain surfaces. MPc layer structures of the invention naturally lie flat on non-reactive metals. Deposited oxide/MPc layer structures of the invention have high thermal and chemical stability. For example, $Al_2O_3$/MPc structures are stable at temperatures over 250° C., even in solution, such as acetone. Due to these properties, an $Al_2O_3$/MPc layer structure of the invention can deposited on metal, glass and ceramic surface and act as passivation layer from external contaminants. It can also act as gate dielectric or tunnel dielectrics. The MPc layer will provide for higher quality $Al_2O_3$ deposition compared to omitting its use in an otherwise equivalent structure.

Preferred embodiments of the invention will now be discussed with respect to experiments and the drawings. The drawings may include schematic representations, which will be understood by artisans in view of the general knowledge in the art and the description that follows. Features may be exaggerated in the drawings for emphasis, and features may not be to scale.

Experiments were conducted to demonstrate the ability to form MPc layer structures of the invention. The experiments demonstrate that MPc layer structures, including monolayer, ordered bilayer and ordered multilayer structures within 2D layer stacks provide non-polar and polar MPc layer structures. Results show that MPc can form defect-free thin layer on metal and 2D materials.

In particular experiments, MPc were deposited as thick over layers on an Au (111) or clean HOPG or single layer graphene at 100° C. by organic molecular beam epitaxy. FIGS. 1A-2B show a CuPc monolayer, which is non-polar MPc. During deposition, MPc molecules in the evaporation source are heated in 360° C. for sublimation of MPc. Subsequently, this deposited CuPC multilayer on Au was annealed at 350° C. for 4 min, while deposited multilayers on HOPG were heated with a lower temperature anneal 200° C. for 6 min, and a flat-lying monolayer of CuPc was formed on the Au(111) and HOPG surface. Explanation of the mechanism is not necessary to the invention and does not limit the invention, but the formation of the monolayer from the multilayer after the annealing is attributed to the weaker MPc/MPc interaction in multilayers compared to MPc/graphene surface interaction. See, Bucholz & Somorjai, "The surface structures of phthalocyanine monolayers and vapor grown films: A low energy electron diffraction study," The Journal of Chemical Physics 66, 573 (1977). FIGS. 1A-2B show that the MPc monolayer is nearly defect free on Au(111) and HOPG respectively. This experiment showed that an MPc monolayer can be deposited on various surfaces, such as metal and semiconductor surfaces, while density of defects can be minimized with a simple post-annealing.

Figures 3A, 3B:
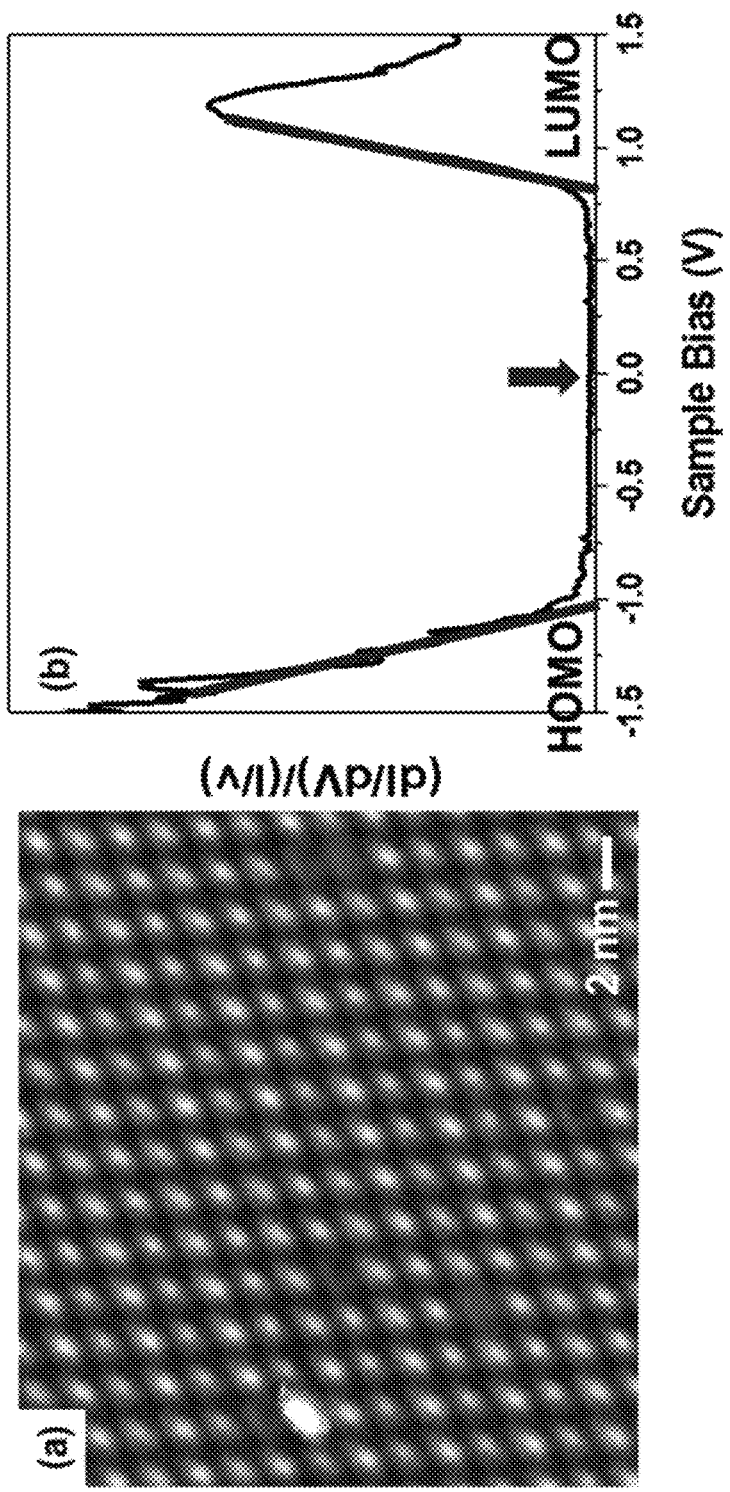
FIG. 3A is an Empty-state STM image of a TiOPc monolayer deposited in accordance with an embodiment of the invention HOPG (Vs=2.0 V, It=20 pA)
FIG. 3B shows (dI/dV)/(I/V) STS spectra measured on central O ion of TiOPc molecules deposited on HOPG.

In another experiment, deposition of TiOPc layer, which is a polar MPc, was performed by same MBE method on HOPG followed by the low temperature annealing (250° C.). It is noted that if TiOPc layer heated at 250° C. for more than 6 min, TiOPc molecules lift additionally from HOPG, thus bare HOPG can be exposed. After deposition of TiOPc and post annealing, the TiOPc molecules form a flat lying monolayer with only few defects, and the crystal structure of monolayer has four-fold symmetry, as shown in FIG. 3A. In the monolayer, a bright spot at the center of each O-TiPc molecules is attributed to oxygen. Observation of bright protrusion indicates that O-TiPc of monolayer is directed outward to vacuum. The oxygen species has dipole moments that can be confirmed in STS. In STS, Fermi level is shifted to LUMO (conduction band), as shown in FIG. 3B.

Experiments showed that the thickness of the MPc layer can be controlled with either annealing temperature or duration. An experiment showed that thickness of the TiOPc layer can be modulated easily. FIG. 4A shows that shorter annealing duration allows retention of a second layer. It is expect this will also work for solution deposited TiOPc and related materials. In the second layer (bilayer), TiOPc molecules are deposited between TiOPc of the first monolayer, as illustrated in FIG. 4B. A dark hole is observed on the second layer, which indicates the TiOPc molecules in the second layer have downward orientation in second layer, whereas the TiOPc of the first monolayer is directed outward to vacuum (upward orientation). This shows that the TiOPc monolayer can provide a template for ALD source on graphene, and that a TiOPc second layer can be applied to an ultrathin capacitor or in a BiSFET between two graphene layers.

Figures 5A, 5B, 5C:
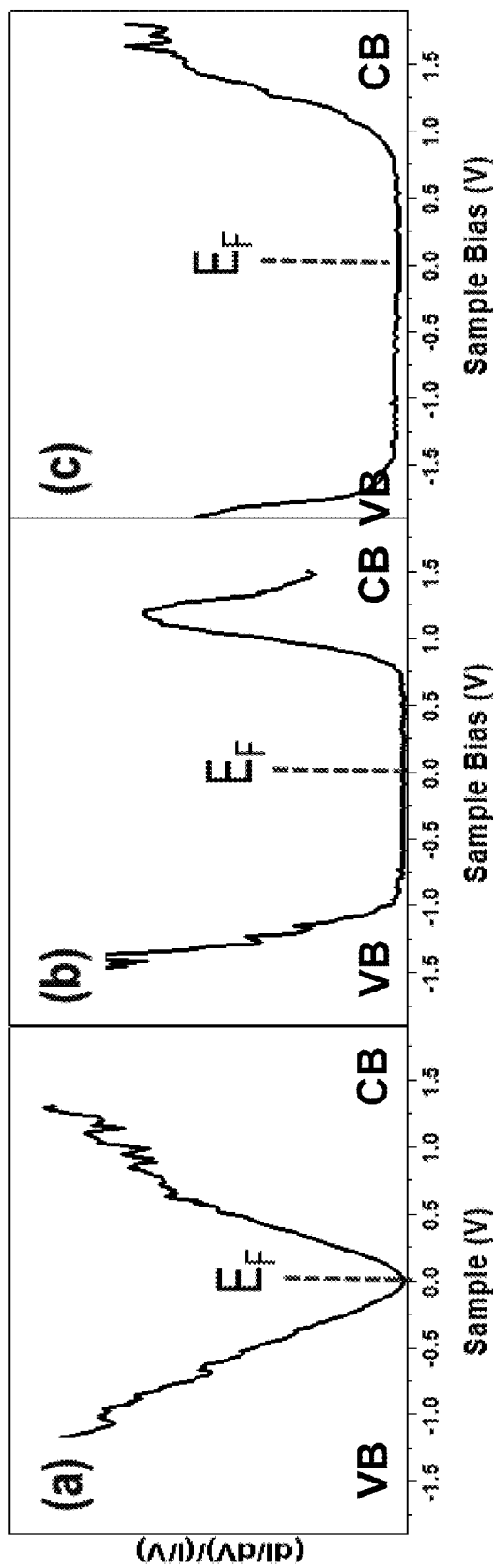
FIG. 5A-5C respectively show (dI/dV)/(I/V) STS spectra measured on HOPG; on a TiOPc monolayer; and on a TiOPc bilayer.

In another experiment, STS measurements were made to compare HOPG, TiOPc monolayer and TiOPc bilayer structures electronically. The data are respectively shown in FIGS. 5A-5C. Clean HOPG (FIG. 5A) shows zero band gap, indicating a semi metallic band structure. However, the band gap increases with increasing thickness of the TiOPc layer structure. The monolayer of TiOPc and HOPG (FIG. 5B) has approximately 1.7 eV as the band gap. The band gap increases to 2.5 eV for the TiOPc bilayer on HOPG. This experiment shows that TiOPc can act as an insulating tunnel barrier.

This thickness dependent band gap of TiOPc is useful in a BiSFET. The ability to provide both insulation and low dielectric constant is important to the BiSFET.

Figure 6:
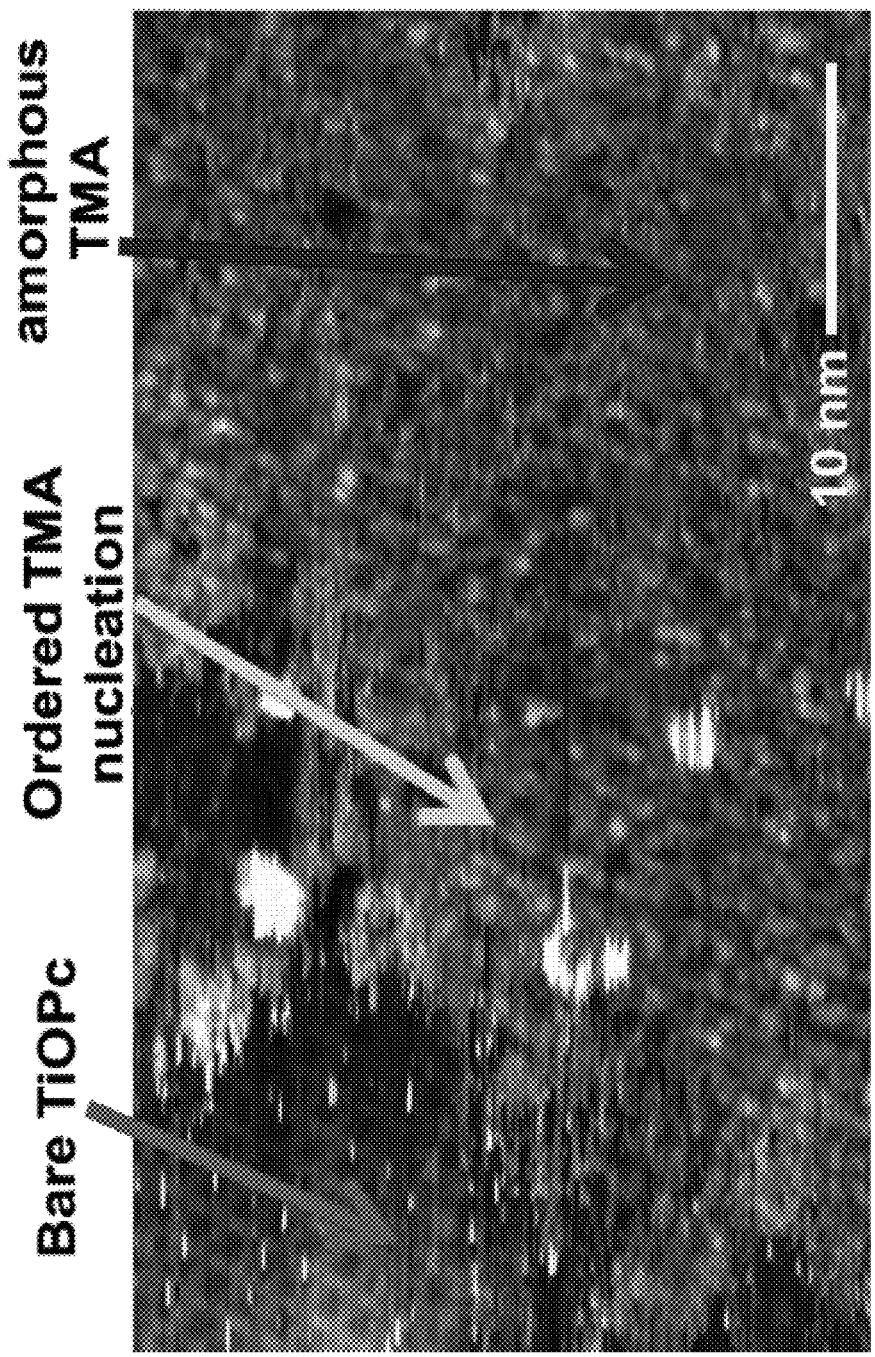
FIG. 6 is an empty-state STM image of a TMA/TiOPc monolayer on HOPG (Vs=2.0 V, It=10 pA) deposited in accordance with an embodiment of the invention.

Additional experiments demonstrated that an MPc monolayer on a surface in accordance with the invention can also provide a nucleation template for ALD deposition of a subsequent layer. In this experiment, TMA was introduced and, as shown in FIG. 6, TMA sticks to the TiOPC monolayer/HOPG at 100° C. TiOPc has intrinsic dipole moment and is able to induce uniform oxide layer formation also on graphene.

Figures 7A, 7B, 7C:
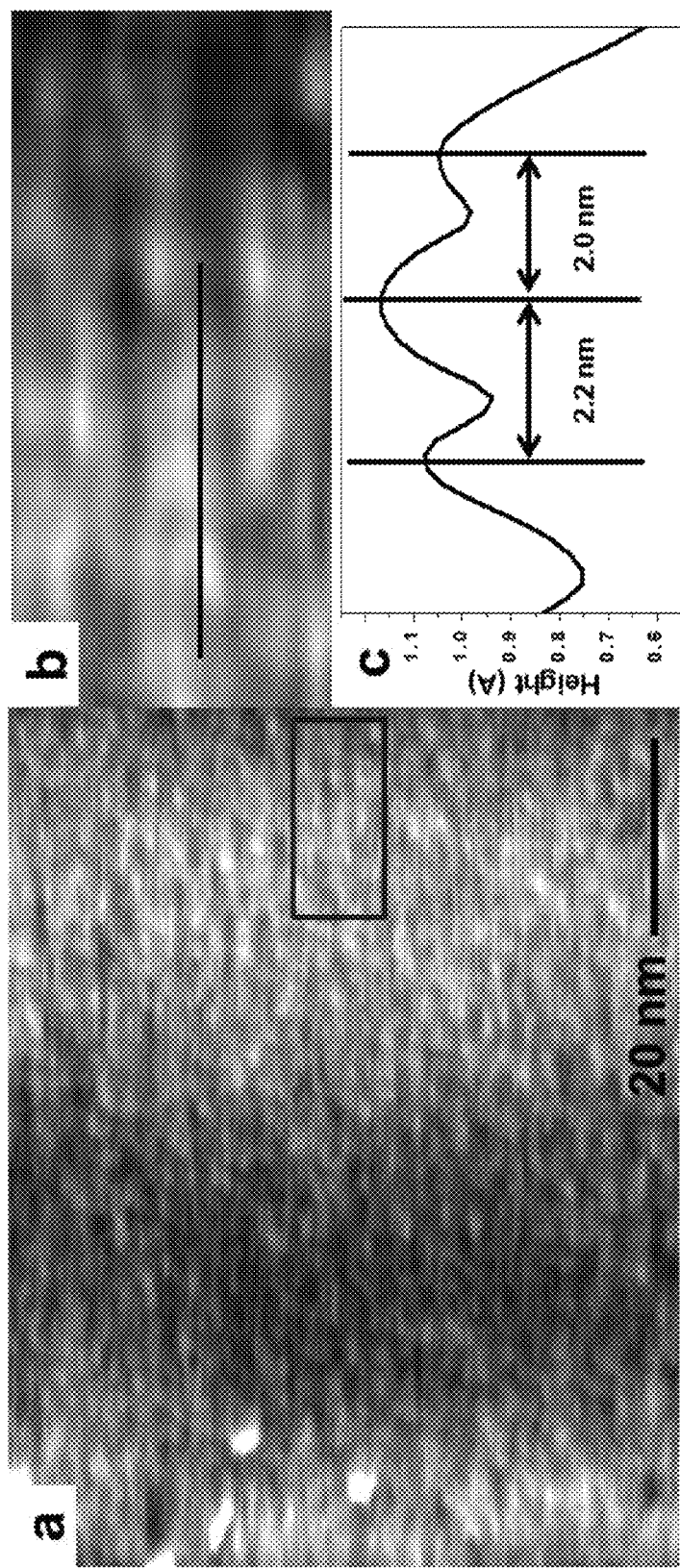
FIGS. 7A-7B are empty-state STM images of a 1 cycle $Al_2O_3$/TiOPc monolayer/HOPG that was deposited via a preferred method of the invention.
FIG. 7C is the line trace plot in from FIG. 7B.

After ALD 1 cycle (TMA+$H_2O$) on TiOPc/HOPG at 100° C., $Al_2O_3$ appear on each unit cell, and coverage of $Al_2O_3$ is almost 100%, as shown in FIG. 7A. This coverage indicates TMA is reacted with each TiOPc molecules and transformed to $Al_2O_3$ by fallowing water. In FIG. 7B, ordered $Al_2O_3$ moieties are represented, and spacing between $Al_2O_3$ moieties is 2~2.2 nm in FIG. 7C. It is note spacing between TiOPc is 1.7 nm. As a result, it can be conclude although TMA is reacted with central O of TiOPc, $Al_2O_3$ is grown asymmetrically on TiOPc.

Figures 8A, 8B:
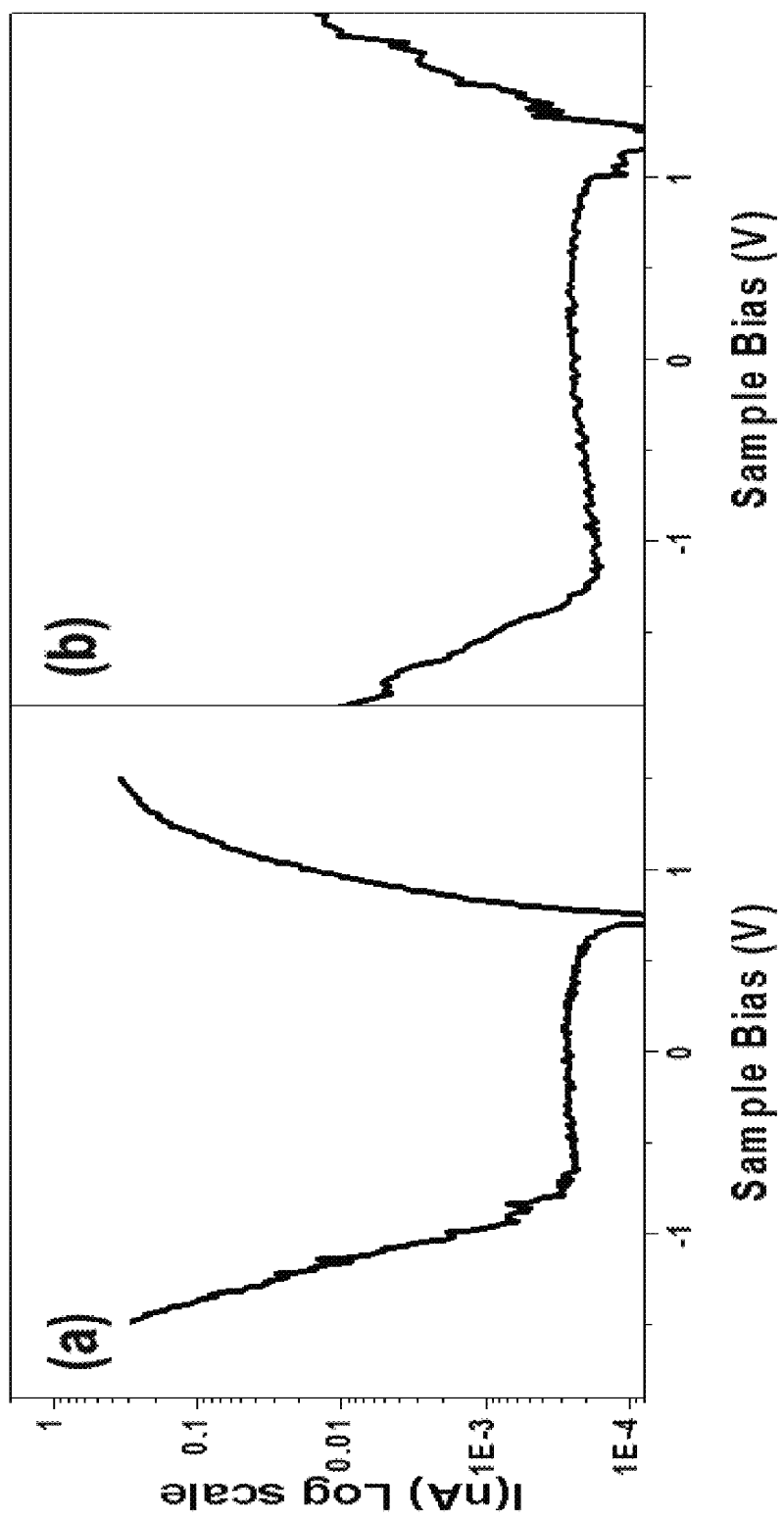
FIG. 8A is a plot of STS conductance vs bias on clean TiOP/HOPG.
FIG. 8B is a plot of STS conductance vs bias on AlxOx/TiOPc/HOPG formed via a preferred method of the invention.

FIGS. 8A and 8B show that after 5 cycles of ALD (TMA+$H_2O$), tunneling current is significantly decreased. Decrease of tunneling current indicates $Al_2O_3$ is deposited on TiOPc/HOPG. This demonstrates that MPc monolayers of the invention can provide a nucleation layer for amorphous low K oxide ALD.

FIGS. 9A-9F are XPS data from experiments that show that the deposited quality of $Al_2O_3$/MPc can be improved by post annealing. In XPS spectra of FIGS. 9A-9F there is transition of chemical states in the oxygen 1 s peak; with annealing, intensity of the left peak decrease (FIG. 9D, left downward arrow), while intensity of right peak increases (FIG. 9D, right upward arrow), after annealing at 250° C. There is also a shift of binding energy of red oxygen 1s states. The Al 2p states are also shifted from 74.58 eV to 75.10 eV. The chemical shifts of O and Al indicate that annealing converts remained Al—OH to $Al_2O_3$.

After annealing at 250° C., a Ti 1s peak is still observed in $Al_2O_3$/TiOPc/HOPG. It is also noted that TiOPc will not be stable on the HOPG above of 150° C. without $Al_2O_3$. The experiments show that the deposited $Al_2O_3$ acts as the cage, which holds the TiOPc to the HOPG surface.

Figures 10A, 10B:
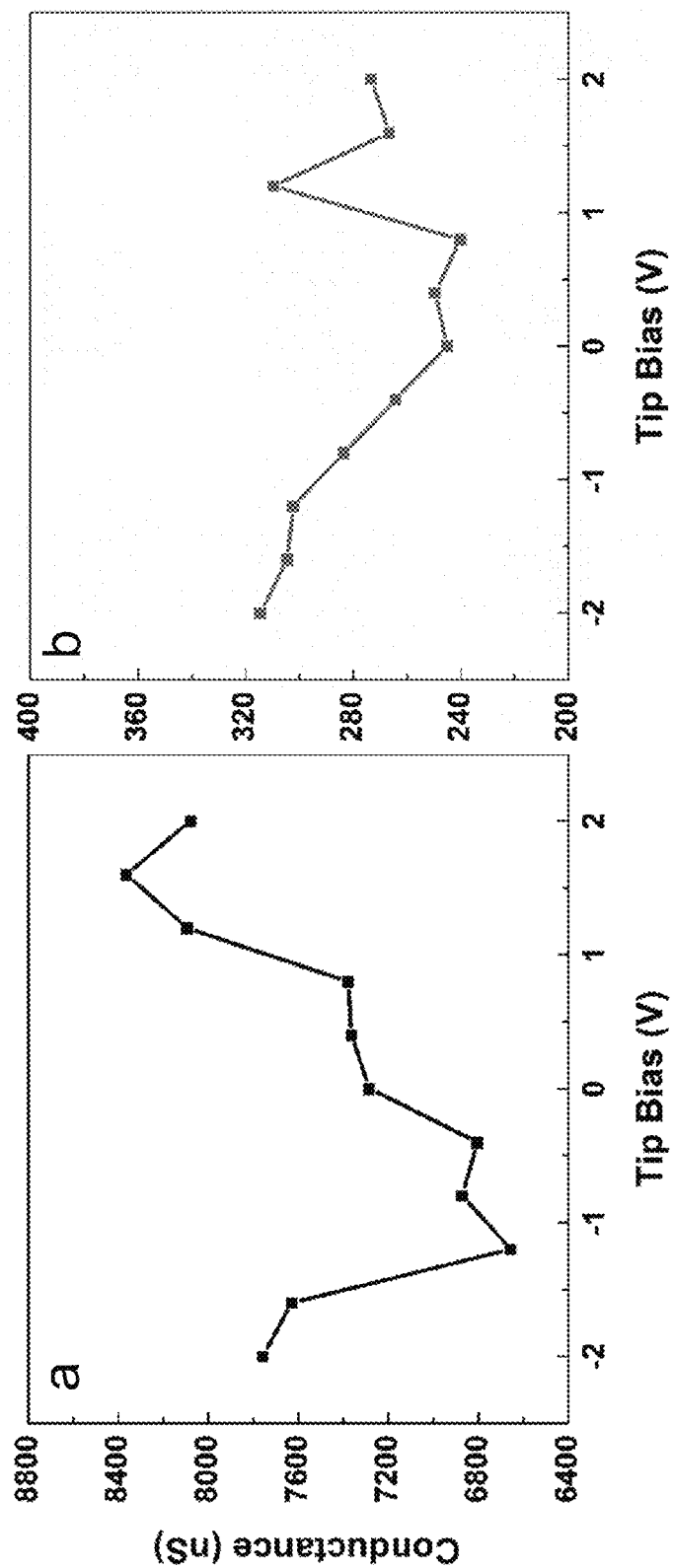
FIGS. 10A-10B show the gateless conductance-voltage of 10 cycle TMA-$H_2O$ ALD before and after post annealing 250° C. on TiOPc/HOPG that was deposited via a preferred method of the invention.

FIGS. 10A and 10B show that post annealing can improve insulating property of $Al_2O_3$/TiOPc/HOPG. After annealing 10 cycle $Al_2O_3$/TiOPc/HOPG at 250° C., conductance decrease more than an order of magnitude and a finite capacitance was measured. It is noted that these conductances were measured without gate. This improvement of insulating property is consistent with transition of chemical states of O and Al, which indicate transformation from Al—OH to $Al_2O_3$ during annealing.

Figure 11B:
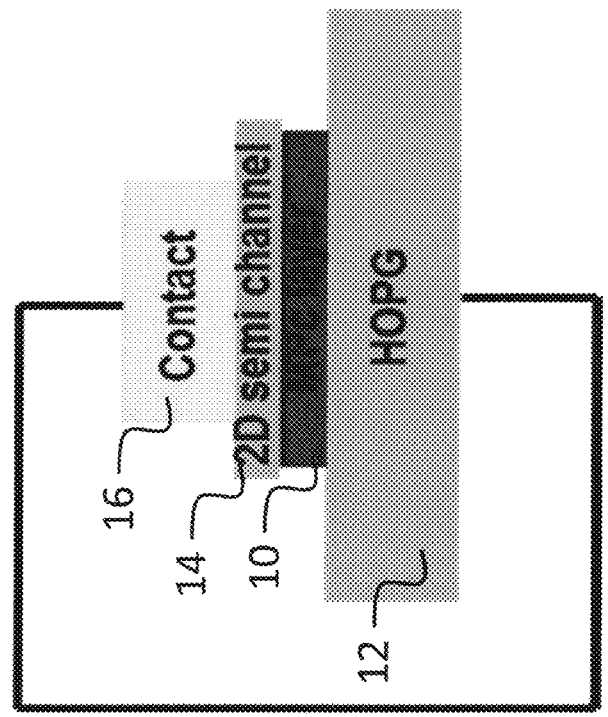
FIGS. 11A-11B show a preferred insulator layer formation process of the invention for forming specific devices.
Figure 11A:
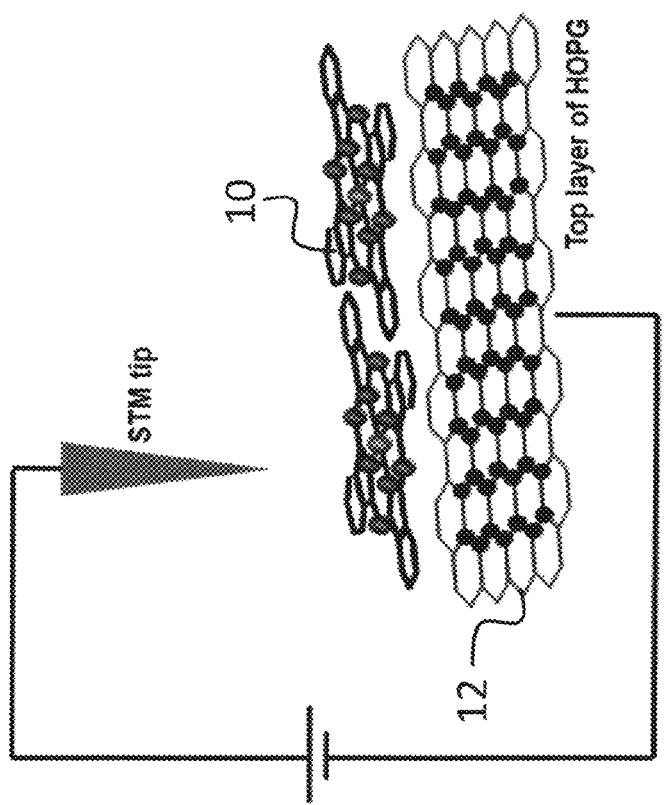

A preferred process for forming specific example devices will now be discussed. A first step is shown in FIG. 11A. During this step, thickness of MPc layer 10 is deposited on a surface 12, such as HOPG, and then is optimized for ALD processing for a BiSFET or GIG device via the deposition and annealing steps above discussed above. FIG. 11A also shows an STM set up that can be used to investigate electronic properties of the monolayer of MPc monolayer, ordered bilayer or ordered multilayer. FIG. 11B shows that a 2D semiconductor 14 and contact 16 can be formed upon the MPc to complete a suggested device, with sample devices being shown in FIG. 11C-E. The device configuration can be graphene/MPc layer/graphene or graphene/$Al_2O_3$/MPc layer/graphene. The device configuration of FIG. 11B permits measurement of capacitance and IV spectra, and determination of insulating properties of particular formed MPc layer structures.

Figure 11C:
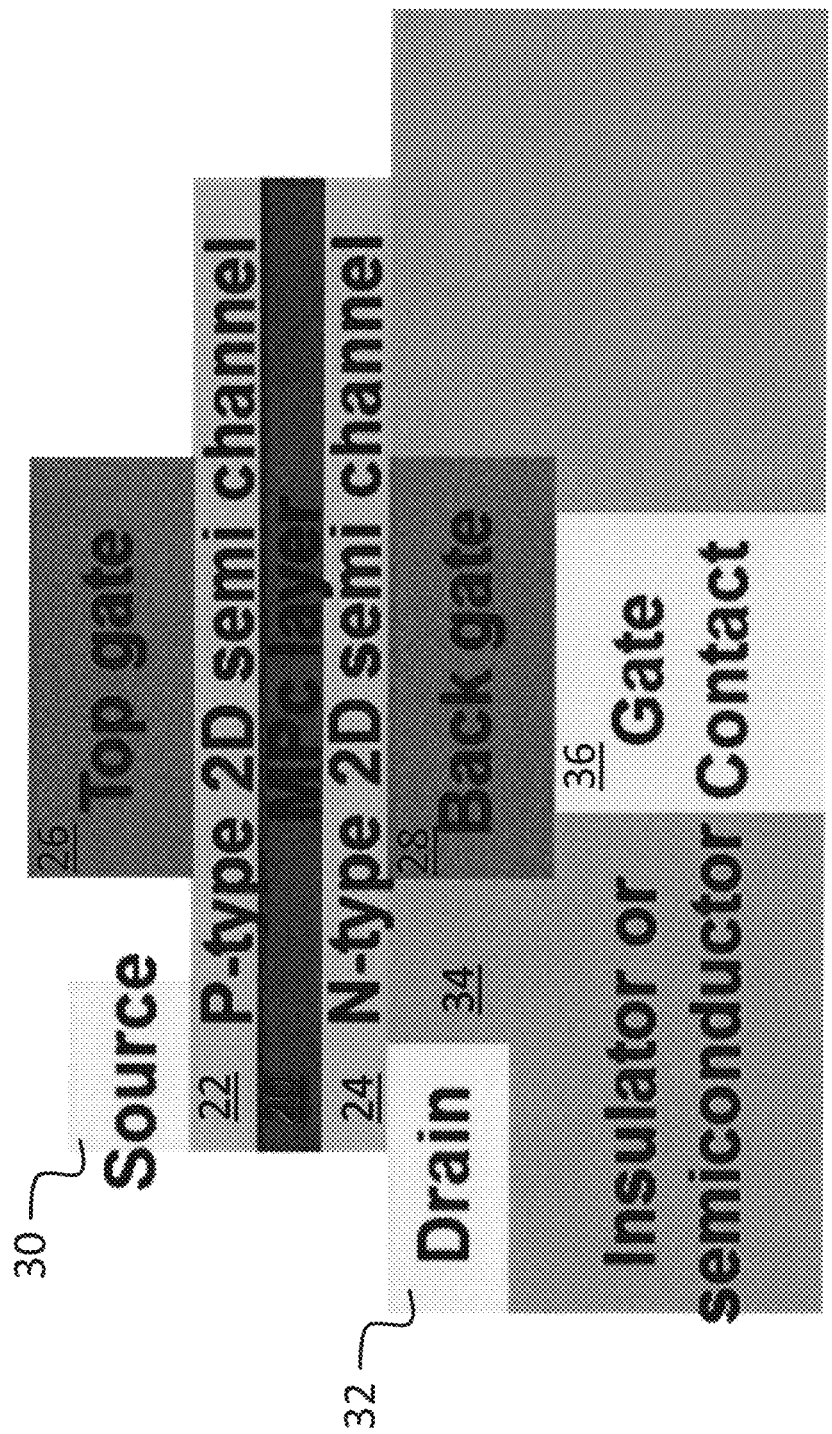
FIGS. 11C-11E show specific example devices of the invention incorporating an insulator layer of the invention.
Figure 11D:
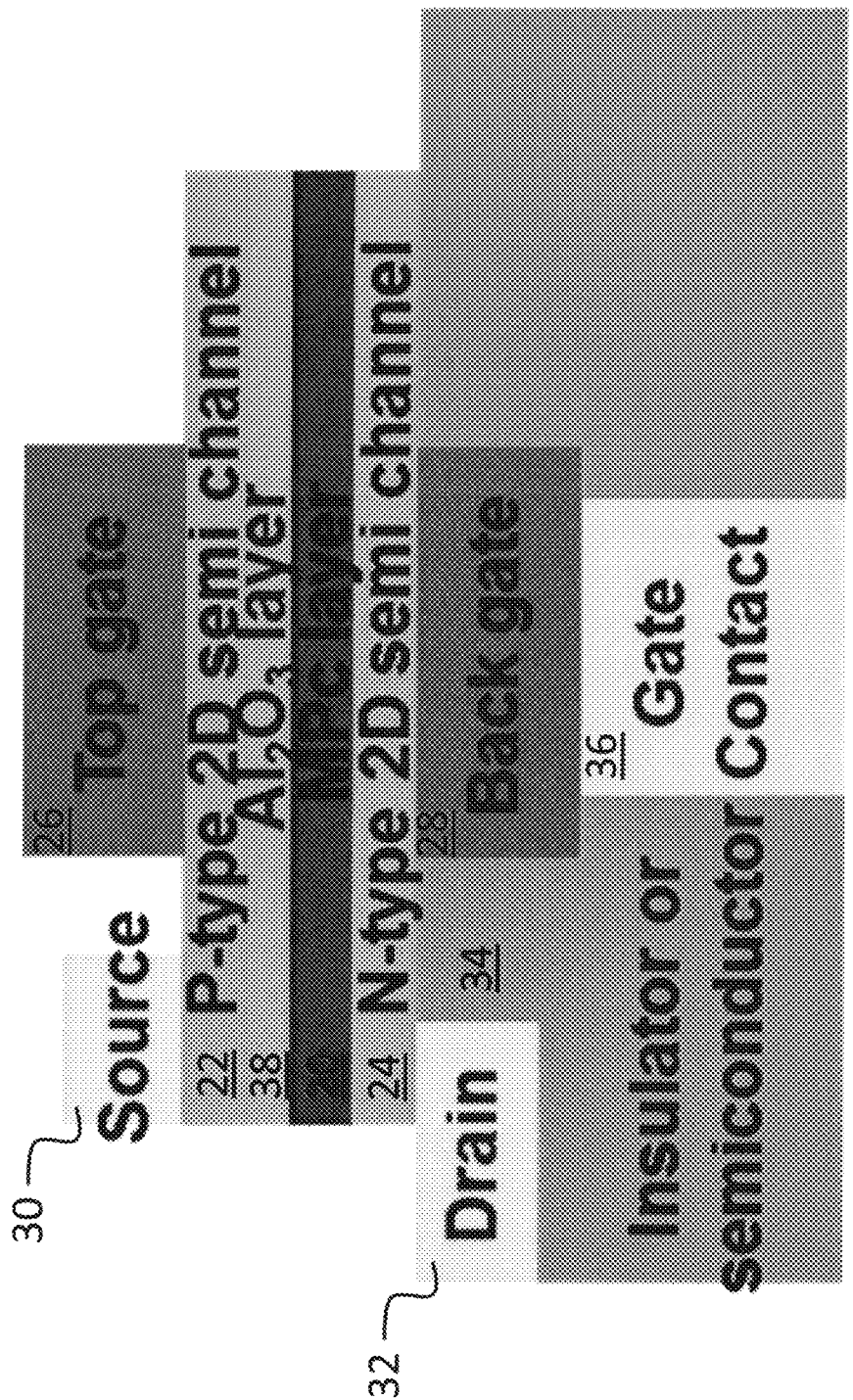
Figure 11E:
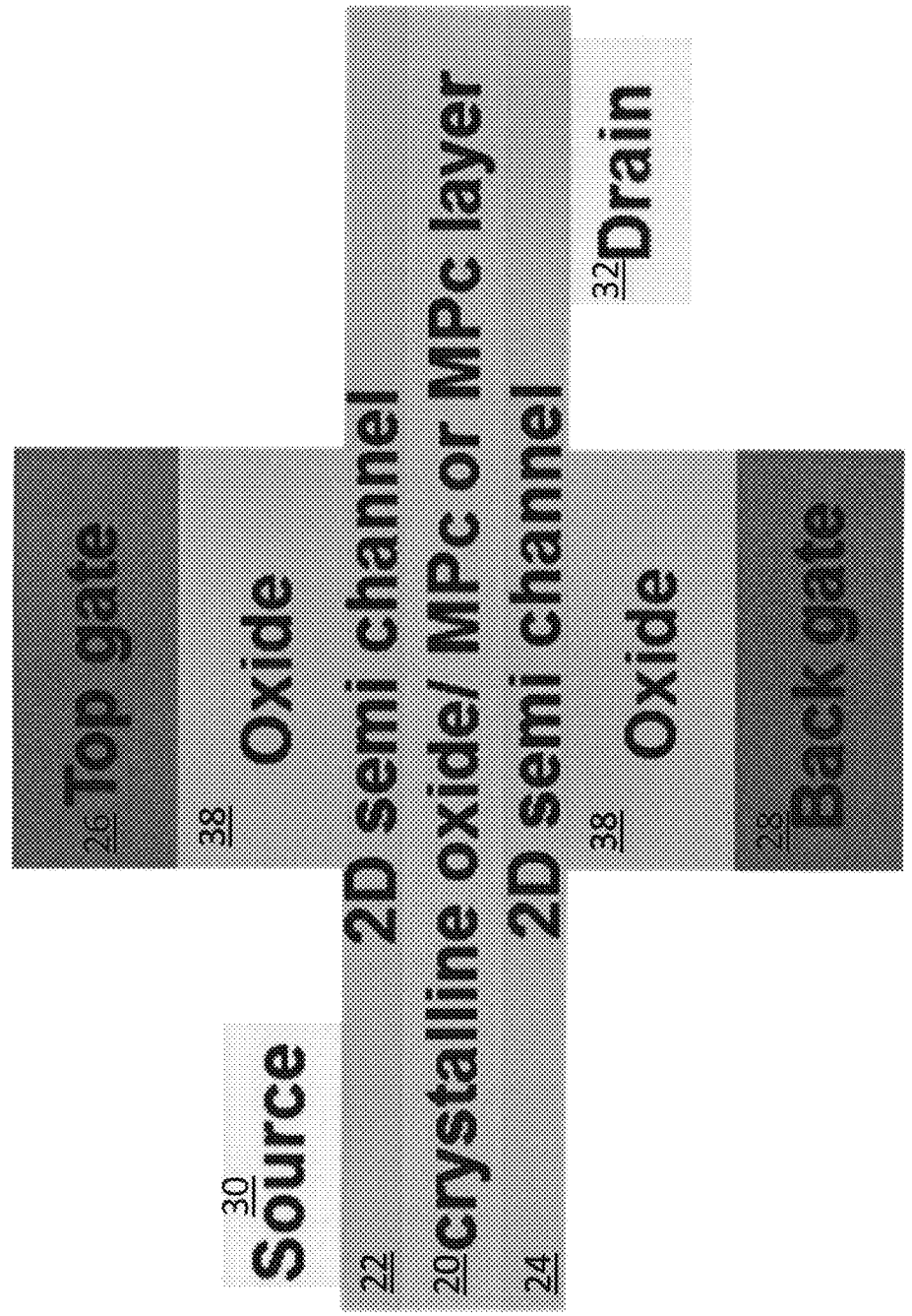

FIGS. 11C-11E show specific preferred devices of the invention. FIG. 11C is a BiSFET. An MPc monolayer, bilayer or multilayer 20 is between n-type 2D semiconductor layers 22 and p-type 2D semiconductor 24. Top metal gates 26 are deposited on the n-type 2D semiconductor layers 22. Bottom gates interface the layers 28, and gate contact 36 is made through bulk semiconductor or insulator 34. Source 30 and drain 32 contacts, which are preferably formed of Au, complete the device. It is noted that electrons and holes move separately from source to drain through n-type and p-type semiconductors respectively, while electron and hole-form indirect coupling. FIG. 11D is Ultra-thin insoluble $Al_2O_3$/MPc for BISFETs. The structure is similar to that of the FIG. 11C device, but also includes an $Al_2O_3$ layer 38 upon the MPc monolayer, bilayer or multilayer 20. FIG. 11E illustrates extreme EOT oxide for tunnel FETs. The FIG. 11E device is also labeled with common reference numerals to indicate like portions. It is noted that the insulted layer 20 can be crystalline oxide/MPc layer, such as ZnO, or solely crystalline multi MPc layer for tunnel FETs.

Artisans will recognize that many other devices can benefit from and incorporated MPc based layer structures of the invention. As an example, deposition of $Al_2O_3$/MPc layer can act as protecting layer on various surface (metal, ceramic and glass) from outer physical or chemical damages. This versatility of $Al_2O_3$/MPc layer results from relatively simple deposition methods of the invention and the resultant high chemical stability of $Al_2O_3$/MPc layer. As another example, 2D semiconductor FETs have a primary application in low power high speed logic devices. They are considered to be a potential successor to silicon or even SiGe, Ge, and III-V metal oxide semiconductor field effect transistors (MOSFET). MOSFETs are the standard transistor used in all commercial logic chips. Our graphene/MPc/graphene novel device (BISFET and tunnel FET), which includes a MPc monolayer inserted between two layers of graphene, is expected to show a high speed of charge carrier, which results from ballistic transport of charge carriers in graphene, and low power consumption compared to state of the art devices. Therefore, devices of the invention are a strong candidate to replace current logic devices which are based on Si or on conventional III-V structures.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for passivation of surfaces from external contaminants, and functionalization of inert surfaces, comprising:
   depositing metal phthalocyanine (MPc) on and directly in contact with an inert surface to form a partial multi-layer;
   annealing the metal phthalocyanine at a temperature and duration selected to transform the partial multi-layer into one of a monolayer, ordered bilayer or ordered multi-layer;
   depositing a 2D layer upon the one of a monolayer, ordered bilayer or ordered multi-layer.

2. The method of claim 1, wherein the inert surface comprises a 2D layer.

3. The method of claim 1, wherein said depositing a 2D layer comprises atomic layer deposition of a material upon the one of a monolayer, ordered bilayer or ordered multi-layer.

4. The method of claim 1, wherein the inert surface comprises one of an oxide, insulator, glass, ceramic and polymer.

5. The method of claim 1, wherein the inert surface comprises one of a semiconductor nanowire and a carbon nanotube.

6. The method of claim 1, wherein said depositing a 2D layer comprises depositing an $Al_2O_3$ layer on the one of a monolayer, ordered bilayer or ordered multi-layer.

7. The method of claim 1, wherein the metal phthalocyanine comprises one of TiOPc, AlOHPc, VOPc, FePc, CoPc, CuPc or other metal Pc, i.e. M is one of TiO, AlO, VO, Fe, Co, Cu or another metal ion or $H_2$ ($H_2$Pc), or crown-ether MPc.

8. The deposition method of claim 1, wherein the MPc is an ordered monolayer, ordered bilayer, or ordered multilayer of one of TiOPc, AlOHPc, VOPc, crown ether Pc, wherein said depositing metal phthalocyanine (MPc) comprises vacuum deposition or solution deposition, and said annealing is conducted in vacuum or an inert environment that does not react with the MPc or surface at a processing temperature.

9. The method of claim 1, wherein said depositing a 2D layer comprises conducting atomic layer deposition (ALD) of a material with direct nucleation on the monolayer, ordered bilayer or ordered multi-layer, wherein the MPc is one or TiOPc, AlOHPc, and VOPc having a polar group, or a purely metal phthalocyanine (ex CoPc) after reaction with an OH donor.

10. The method of claim 1, wherein said depositing a 2D layer comprises conducting atomic layer deposition (ALD) to form sub 1 nm layer on the MPc to induce the MPc to be stable upon vacuum annealing in excess of 250° C. thereby enabling high capacitance lower conductivity oxide films to be formed.

11. The method of claim 1, wherein the MPc comprises a polar MPc that induces field effect doping in a semiconductor device by forming with a dipole and uniform asymmetric bond having an electron rich group pointed away from the surface.

12. The method of claim 1, wherein said depositing metal phthalocyanine (MPc) comprises solution deposition.

13. A method for passivation of surface from external contaminants, and functionalization of inert surfaces, comprising:
   depositing metal phthalocyanine (MPc) on and directly in contact with a surface to form a partial multilayer;
   annealing the metal phthalocyanine at a temperature and duration selected to transform the partial multi-layer into one of a monolayer, ordered bilayer or ordered multi-layer; and
   depositing a 2D layer upon the one of a monolayer, ordered bilayer or ordered multi-layer;
   wherein the surface comprises a 2D semiconductor.

14. A method for passivation of surfaces from external contaminants, and functionalization of inert surfaces, comprising:
   depositing metal phthalocyanine (MPc) on an inert surface to form a partial multilayer;
   annealing the metal phthalocyanine at a temperature and duration selected to transform the partial multi-layer into one of a monolayer, ordered bilayer or ordered multi-layer;
   depositing an oxide layer upon and directly in contact with the one of a monolayer, ordered bilayer or ordered multi-layer; and
   depositing a 2D layer upon the oxide layer.

15. A method for passivation of surfaces from external contaminants, and functionalization of inert surfaces, comprising:
   depositing metal phthalocyanine (MPc) on and directly in contact with a surface to form a partial multilayer;
   annealing the metal phthalocyanine at a temperature and duration selected to transform the partial multi-layer into one of a monolayer, ordered bilayer or ordered multi-layer, wherein the surface comprises graphene or another 2D semiconductor, and further comprising a step of depositing graphene or another 2D semiconductor upon the one of a monolayer, ordered bilayer or ordered multi-layer.

16. A layer structure in a semiconductor device, the layer structure comprising one of an ordered monolayer, ordered bilayer or ordered multi-layer consisting of metal phthalocyanine low K dielectric upon and directly in contact with an inert surface, and one of an ALD deposited layer or 2D semiconductor on the one of a monolayer, ordered bilayer or ordered multi-layer of metal phthalocyanine.

17. The layer structure of claim 16, wherein the surface and the 2D semiconductor comprise graphene or another 2D semiconductor.

* * * * *